United States Patent [19]

DiMarco

[11] Patent Number: 5,436,585

[45] Date of Patent: Jul. 25, 1995

[54] BINMOS DRIVER CIRCUIT WITH INTEGRATED VOLTAGE SUPPLY CONVERSION

[75] Inventor: David DiMarco, Hillsboro, Oreg.

[73] Assignee: Intel Corporation, Santa Clara, Calif.

[21] Appl. No.: 242,790

[22] Filed: May 16, 1994

[51] Int. Cl.⁶ .............................................. H03L 5/00
[52] U.S. Cl. ..................................... 327/333; 327/319;
326/62; 326/80; 326/81
[58] Field of Search ......................... 326/63, 64, 65, 66,
326/67, 68, 69, 70, 71, 72, 73, 74, 75, 76, 77, 78,
79, 80, 81; 327/319, 333

[56] References Cited

U.S. PATENT DOCUMENTS

| | | | |
|---|---|---|---|
| 4,713,600 | 12/1987 | Tsugaru et al. | 327/333 |
| 4,733,105 | 3/1988 | Shin et al. | 327/333 |
| 5,132,569 | 7/1992 | Matsuda | 326/65 |
| 5,136,191 | 8/1992 | Nunogami | 326/81 |
| 5,151,620 | 9/1992 | Lin | 326/71 |
| 5,223,751 | 6/1993 | Simmons et al. | 326/71 |
| 5,331,224 | 7/1994 | Ohannes et al. | 326/65 |

OTHER PUBLICATIONS

Popescu, et al., "The Metaflow Architecture," IEEE Micro, pp. 10-13 and 63-73, Jun. 1991.

Primary Examiner—Timothy P. Callahan
Assistant Examiner—Jeffrey Zweizig
Attorney, Agent, or Firm—Blakely, Sokoloff, Taylor & Zafman

[57] ABSTRACT

A circuit for converting an input signal derived from a low voltage power supply to an output signal derived from a high voltage power supply is disclosed. A driver circuit and a conversion circuit simultaneously receive the low voltage input signal. The driver circuit changes states when the input signal transitions and the output signal switches accordingly. The conversion circuit simultaneously generates a high voltage signal that causes a decoupler circuit to eliminate any DC leakage through the driver circuit. The driver circuit utilizes a bipolar transistor to increase drive capability.

2 Claims, 2 Drawing Sheets

5,436,585

BINMOS DRIVER CIRCUIT WITH INTEGRATED VOLTAGE SUPPLY CONVERSION

BACKGROUND OF THE INVENTION

1. Field of the Invention

The invention relates generally to the operation of integrated circuits. More particularly, the invention relates to the conversion of a signal derived from a circuit operating from a low voltage power supply to a signal derived from a circuit operating from a high voltage power supply.

2. Background of the Invention

As the various components of a computer system, including the microprocessor, memory, and control logic have become smaller, the voltage level of the power supply utilized by these components has been reduced. This reduction has not occurred uniformly across all components, however, and as a result it has become necessary to interface components which operate at different voltage levels. A voltage supply conversion circuit that converts a signal of one voltage level to a signal of another voltage level is normally used to accomplish this interface.

Past implementations of conversion circuits have utilized an initial conversion circuit in combination with a driver circuit. The initial conversion circuit converts an input signal into a second signal of the desired high voltage level. The second high voltage signal is then applied to the driver circuit which drives the output to the appropriate logic level. This method can introduce too much delay when the transmission speed of the signal is critical, however, because the steps of converting and driving the signal are done sequentially.

Other previous implementations of conversion circuits have used a single driver circuit to improve transmission speed. These circuits, however, tend to leak current when in a static state because when the input signal to be converted is at a lower voltage than the output signal, the input signal is not sufficiently strong to completely close all DC current paths. This is unacceptable when a computer system design requires minimum DC current draw to minimize either current heating or power consumption, or both.

BRIEF SUMMARY OF THE INVENTION

It is an objective of the invention to provide a BiNMOS driver circuit with integrated voltage supply conversion that introduces minimal delay, provides high drive capability, and leaks no DC current. Special attention is given to the delay introduced when a transition occurs on the output from a high to low logic state.

In accordance with one aspect of the invention, a circuit is provided for converting a signal derived from a circuit operating from a lower voltage power supply ("input signal") to a signal derived from a circuit operating at a higher voltage power supply ("output signal"). The circuit includes a driver circuit for generating the high voltage supply output signal, and a conversion circuit combined with a decoupler circuit for opening a connection between the driver circuit and a high voltage power supply if the output signal is in a first state, and for closing the connection if the output signal is in a second state.

During normal operation, the input signal is applied to the driver circuit and to the conversion circuit. A signal from the conversion circuit is applied to the decoupler circuit which is connected between the driver circuit and the high voltage power supply. When the input signal is in a logic low state, the conversion circuit causes the decoupler circuit to close the connection between the high voltage power supply and the driver circuit, which in turn allows the driver circuit to output a logic high signal. When the input signal is high the conversion circuit causes the decoupler circuit to open the connection between the high voltage power supply and the driver circuit to prevent the driver circuit from leaking DC current.

In accordance with another aspect of the invention, a computer system is provided having a microprocessor, memory and input and output devices coupled together by a system bus. A voltage conversion and driver circuit is connected between the microprocessor operating from the low voltage supply, and a cache memory operating from the high voltage supply. The low voltage output signals from the microprocessor are converted to high voltage level input signals which are coupled to the cache memory.

DETAILED DESCRIPTION OF THE INVENTION

Figure 1:
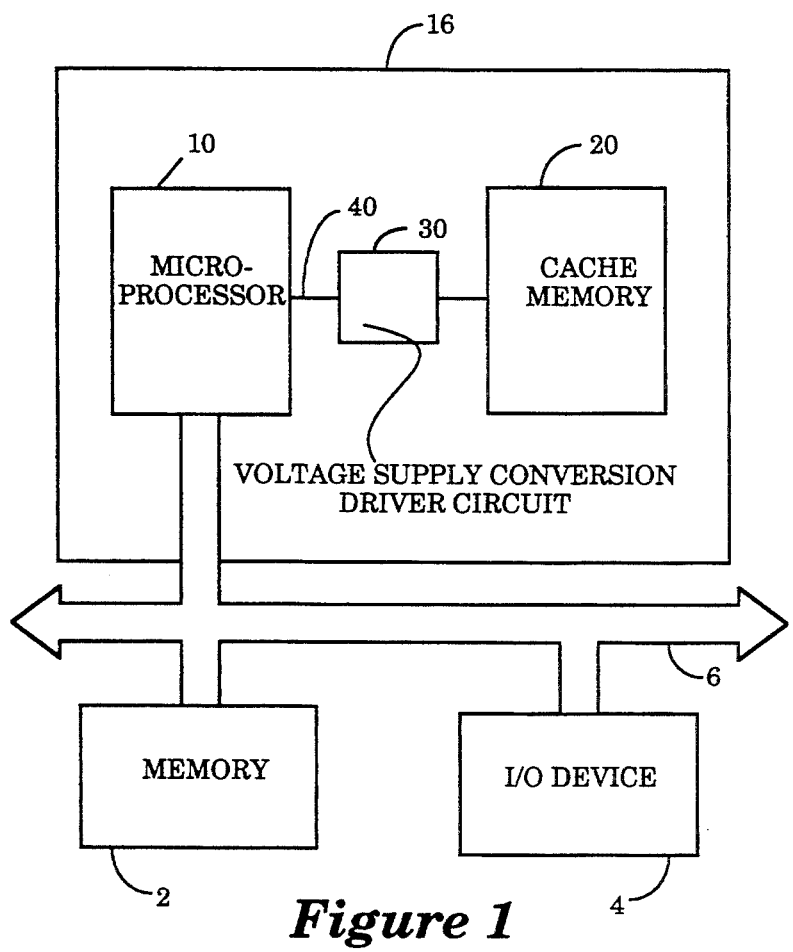
FIG. 1 is a block diagram of a computer system including a voltage converter and driver circuit, configured in accordance with the preferred embodiment at the invention.

FIG. 1 is a block diagram of a computer system including a voltage conversion and driver circuit 30. The system includes a memory 2, an I/O device 4, a microprocessor 10, and a cache memory 20 coupled together by system bus 6. The voltage supply conversion driver circuit 30 is connected between microprocessor 10, which operates at a low supply voltage level, and cache memory 20, which operates at the high supply voltage level. Microprocessor 10, voltage supply conversion circuit 30, and cache memory 20 are all mounted within a single package 16.

For clarity, one voltage supply conversion and driver circuit 30 is shown linking a single data bus line 40 to cache memory 20. In a preferred embodiment, approximately seventy-two data lines 40 connect microprocessor 10 and cache memory 20, each with its own voltage supply conversion and driver circuit 30. Also for the purpose of explanation, power supply voltage levels of 2.9 V and 3.3 V are described herein. However, the only limit to the range of voltages that can be converted is that the lower voltage must be sufficient to turn the circuits on, and the higher voltage must not damage the circuits. Voltage levels between 1.0 and 5.0 volts are reasonable.

Figure 2:
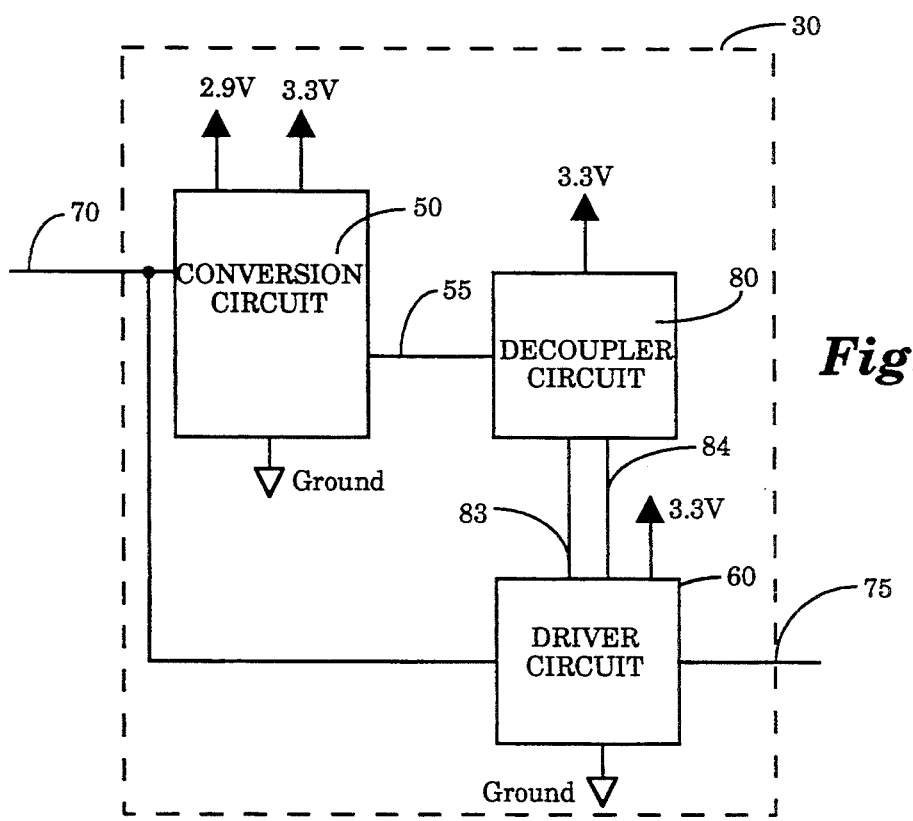
FIG. 2 is a block diagram of a preferred embodiment of the voltage conversion and driver circuit.

FIG. 2 is a block diagram of the voltage supply conversion and driver circuit 30 as configured in the preferred embodiment of the invention. Driver circuit 60 receives the signal derived from a circuit operating from a low voltage power supply on node 70 ("input signal"), and performs a voltage supply conversion by placing an inverted signal referenced to a high voltage power supply on node 75. Simultaneously, conversion circuit 50 also receives the input signal, performs a voltage conversion, and then causes decoupler circuit 80 to either connect or disconnect driver circuit 60 from the high voltage power supply based on the logic state of the input signal. This connecting and disconnecting is done to prevent driver circuit 60 from leaking any DC current during operation, while still allowing it to perform the desired voltage conversion in a rapid manner.

Figure 3:
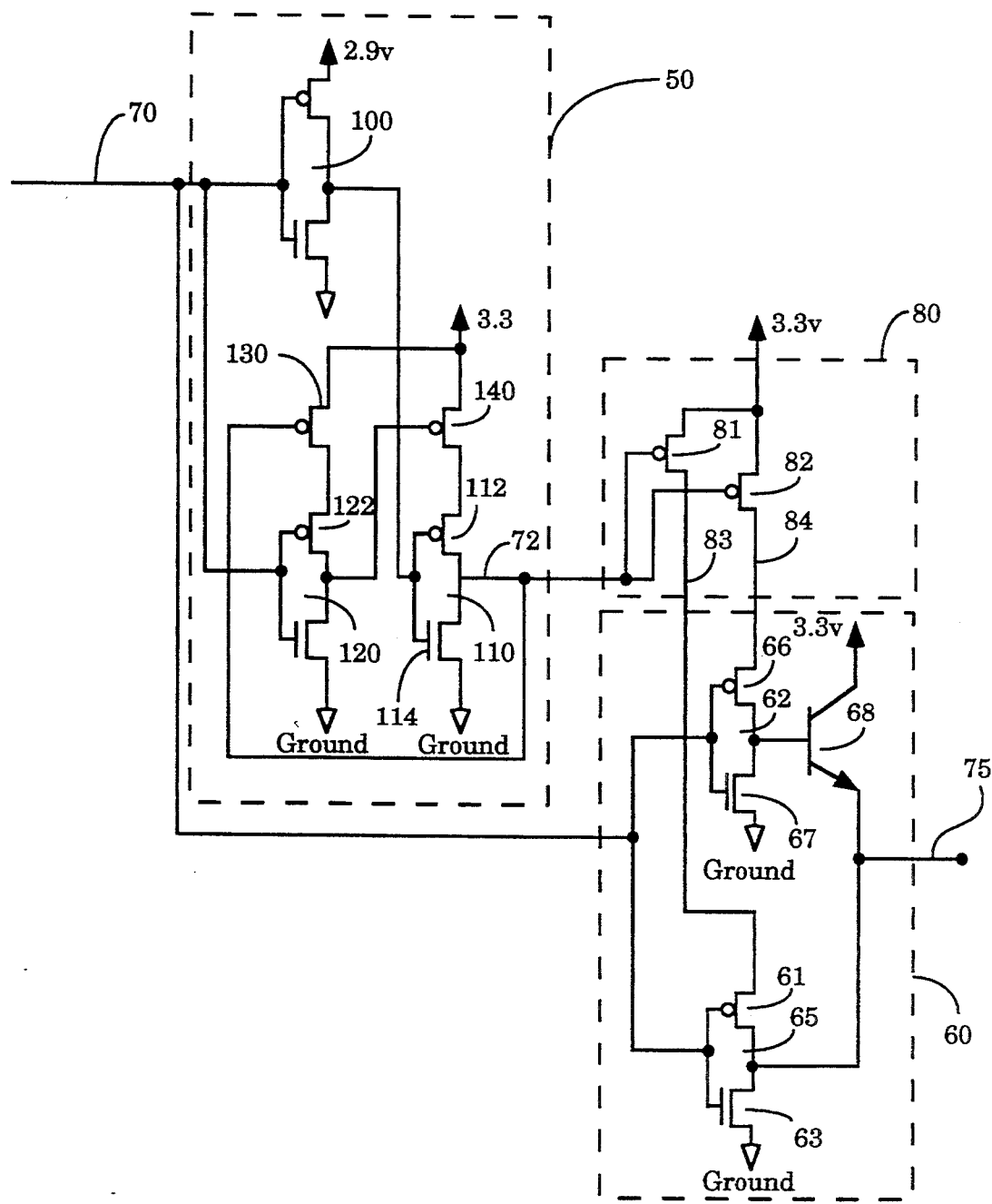
FIG. 3 is a circuit diagram of a preferred embodiment of the voltage conversion and driver circuit.

FIG. 3 is a circuit diagram of voltage conversion and driver circuit 30 of FIG. 2, illustrating the preferred circuitry used to implement driver circuit 60, decoupler circuit 80, and conversion circuit 50, each indicated by dashed boxes. This is representative of the preferred embodiment only, as other implementations that perform the same functions will be apparent therefrom.

Driver circuit 60 consists of two inverter circuits 62 and 65 and a bipolar transistor 68. The collector of bipolar transistor 68 is coupled to the high voltage power supply, its emitter is coupled to the output of inverter 65, and its base is coupled to the output of inverter 62. Inverters 62 and 65 are coupled to the high voltage power supply through decoupler circuit 80 by lines 84 and 83, respectively. The inputs of inverters 62 and 65 are coupled to node 70, and the sources of n-channel transistors 63 and 67 are coupled to ground.

Voltage supply conversion circuit 50 includes three inverters 100, 110 and 120, and two p-channel transistors 130 and 140. Inverter 100 is coupled to the low voltage power supply and receives the input signal derived from a circuit (the microprocessor in the preferred embodiment) operating from the low voltage supply on node 70. Inverters 110 and 120 are coupled to the high voltage power supply through p-channel transistors 140 and 130 respectively. The output of inverter 110 is coupled to decoupler circuit 80 at node 72, which is common gate input node of two p-channel transistors 81 and 82 coupled between the high voltage power supply and nodes 83 and 84, respectively, of the driver circuit 60.

During operation, the input signal on line 70 is applied to inverters 100 and 120 within conversion circuit 50, and inverters 62 and 65 within driver circuit 60. When the input signal is logic low, p-channel transistors 61 and 66 turn on and n-channel transistors 63 and 67 turn off. This couples the base and emitter of bi-polar transistor 68 to nodes 84 and 83 respectively. The logic low input signal also causes inverter 100 to apply a logic high to the input of inverter 110, which in turn causes inverter 110 to place a logic low on node 72. This logic low couples nodes 84 and 83, and therefore the base and emitter of bi-polar transistor 68, to the high voltage power supply by turning on p-channel transistors 81 and 82, causing a logic high derived from a high voltage supply source to be placed on node 75.

When the input signal on node 70 is logic high, p-channel transistors 61 and 66 within driver circuit 60 turn off, and n-channel transistors 63 and 67 turn on. This couples the base and emitter of bi-polar transistor 68 to ground through n-channel transistors 67 and 63 respectively, causing a logic low to be placed on node 75. The logic high on input node 70 also causes inverter 100 within conversion circuit 50 to apply a logic low to inverter 110, which in turn causes inverter 110 to place a high voltage power supply referenced logic high on node 72. The logic high on node 72 turns off p-channel transistors 81 and 82, disconnecting driver circuit 60 from the high voltage power supply.

Disconnecting driver circuit 60 from the power supply when the signal on node 70 is logic high is done to prevent driver circuit 60 from leaking DC current. This DC current leakage is caused by the voltage differential across p-channel transistors 61 and 66 created by the difference between the voltage level of the logic high input signal and that of the high voltage power supply. When the input signal on node 70 is logic high, p-channel transistors 61 and 66 should be completely turned off so that a logic low can be placed on node 75. However, the voltage differential created between the gates of p-channel transistors 61 and 66, which are at 2.9 V, and the sources of these transistors, which are at 3.3 V, causes a 0.4 V source to gate voltage differential allowing them to remain partially on. The combination of these partially turned on p-channel transistors, and n-channel transistors 63 and 67 which are completely turned on by the logic high on node 70, creates a DC current path through inverters 62 and 65. By disconnecting the power supply from driver circuit 60, any DC current leakage through these paths is prevented.

Inverter 120 and p-channel transistor 140 eliminate DC current leakage through conversion circuit 50 when the input signal is logic low. When the input signal is logic low, inverter 100 applies a low voltage supply referenced logic high to inverter 110. Since the source of p-channel transistor 112 is coupled to the 3.3 V power supply, the 2.9 V logic high from inverter 100 creates a 0.4 V source to gate voltage p-channel transistor 112, allowing the transistor to remain partially turned on. This, in combination with n-channel transistor 114 which is completely on, creates a DC current path from power to ground through inverter 110. This DC current path is eliminated by applying the logic low on node 70 from the input signal to inverter 120 causing p-channel transistor 140 to turn off, breaking the connection between the power supply and ground through inverter 110.

P-channel transistor 140 eliminates DC current leakage through conversion circuit 50 when the input signal is logic high. When the input signal is logic high, the 2.9 V signal applied to inverter 120, which is coupled to the 3.3 V power supply, causes p-channel transistor 122 to remain partially on creating a second potential DC leakage current path within conversion circuit 50 through inverter 120. To eliminate this DC current path, the high voltage supply logic high from inverter 110 is applied to p-channel transistor 130, turning it completely off. This eliminates any DC current leakage through conversion circuit 50 when the input signal is logic high.

While the extra circuitry of conversion circuit 50 allows a voltage supply conversion to be performed without DC current leakage, it also causes the voltage supply conversion to be performed more slowly than the one performed by driver circuit 60. This is because it requires two layers of MOS-FET logic to accomplish, as opposed to the one layer used by driver circuit 60. This delay difference causes voltage supply conversion and driver circuit 30 to perform a voltage supply conversion on a transition at input node 70 from low to high more quickly than on a transition from high to low. Driver circuit 60 cannot assert a logic high on node 75 until it is connected to the high voltage power supply. This can only happen after conversion circuit 50 has performed its more time consuming supply conversion. Therefore, the delay introduced when the input transitions from high to low is at least as long as the time required for conversion circuit 50 to perform a supply conversion. To assert a logic low, however, driver circuit 60 need only turn on n-channel transistors 63 and 67 to couple bi-polar transistor 68 to ground. The supply conversion by conversion circuit 50 only prevents DC current leakage through driver circuit 60; it is not needed to assert the signal. The result is that voltage supply conversion and driver circuit 30 converts and drives an input transition from low to high more quickly than a transition from high to low.

By combining driver circuit 60, with conversion circuit 50 and decoupler circuit 80, the goals of rapid voltage supply conversion with no leakage current, and high drive capability are achieved. Driver circuit 60 provides high fanout and drive capability. Conversion circuit 50 converts a high voltage power supply signal to a low voltage power supply signal. Decoupler circuit 80 uses the signal from conversion circuit 50 to eliminate the DC leakage path that would have otherwise occurred through driver circuit 60 when the input signal is logic high. This combination provides rapid signal voltage conversion and high drive capability with no DC current leakage.

Thus, a BiNMOS driver circuit with integrated voltage supply conversion circuit that leaks no DC current, and that introduces minimal delay when a transition from low to high is received has been described. It will be apparent to one skilled in the art that various embodiments of the invention are possible other than one disclosed herein. In general, the exemplary embodiments described herein are merely illustrative of the invention and should not be taken as limiting the scope of the invention.

What is claimed is:

1. A circuit for converting an input logic signal referenced to a low power supply to an output logic signal referenced to a high power supply comprising:
   an input node coupled to receive said input logic signal;
   an output node providing said output logic signal;
   first and second CMOS inverters;
   a bipolar transistor having its collector coupled to said high power supply and its emitter coupled to said output node;
   a first p-channel field-effect transistor (PFET) coupled in series with said first CMOS inverter between said high power supply and ground;
   a second PFET coupled in series with said second CMOS inverter between said high power supply and ground, the gates of said first and second PFETs being coupled to an internal node;
   said first and second CMOS inverters each having their inputs coupled to said input node with said first CMOS inverter having its output coupled to said output node and said second CMOS having its output coupled to the base of said bipolar transistor such that said output logic signal is a compliment of said input logic signal;
   third, fourth and fifth CMOS inverters, said third CMOS inverter being coupled between said low power supply and ground and having its input coupled to said input node and its output coupled to the input of said fifth CMOS inverter, said fourth CMOS inverter having it input coupled to said input node, and said fifth CMOS inverter having its output coupled to said internal node;
   a third PFET coupled in series with said fourth CMOS inverter between said high power supply and ground;
   a fourth PFET coupled in series with said fifth CMOS inverter between said high power supply and ground;
   the gates of said third and fourth PFETs being coupled to said internal node and the output of said fourth CMOS inverter, respectively, such that when said input logic signal is low, said fourth PFET disconnects said fifth CMOS inverter from said high power supply, and when said input logic signal is high, said first, second, and third PFETs disconnect said first, second, and fourth CMOS inverters, respectively, from said high power supply, thereby substantially eliminating current leakage through said circuit.

2. The circuit of claim 1 wherein said high power supply is approximately equal to 3.3 volts and said low power supply is approximately equal to 2.9 volts.

* * * * *